United States Patent [19]
Drapkin

[11] Patent Number: 5,905,621
[45] Date of Patent: May 18, 1999

[54] VOLTAGE SCALING CIRCUIT FOR PROTECTING AN INPUT NODE TO A PROTECTED CIRCUIT

[75] Inventor: Oleg Drapkin, North York, Canada

[73] Assignee: ATI Technologies, Thornhill, Canada

[21] Appl. No.: 09/004,795

[22] Filed: Jan. 9, 1998

[51] Int. Cl.[6] ...................................................... H02H 3/20
[52] U.S. Cl. ................................ 361/111; 361/56; 361/91
[58] Field of Search .............................. 361/91, 56, 111; 257/355, 357

[56] References Cited

U.S. PATENT DOCUMENTS 5,319,259 6/1994 Merrill ..................................... 307/443
5,333,093 7/1994 Krautschneider et al. ............... 361/56

*Primary Examiner*—Jeffrey Gaffin
*Assistant Examiner*—Michael J. Sherry
*Attorney, Agent, or Firm*—Markison & Reckamp, PC

[57] ABSTRACT

A voltage scaling circuit for protecting an input node to a protected circuit uses a voltage shifting circuit that includes two nmos transistors. One nmos transistor is configured as a bi-directional voltage follower and the other nmos transistor is configured as uni-directional voltage follower to facilitate input high level shifting between an input signal node, such as a pin of an integrated circuit and an input node to the protected circuit.

10 Claims, 3 Drawing Sheets

VOLTAGE SCALING CIRCUIT FOR PROTECTING AN INPUT NODE TO A PROTECTED CIRCUIT

BACKGROUND OF THE INVENTION

The invention relates generally to over voltage protection circuits for protecting other circuits from higher than desired voltage levels, and more particularly to voltage scaling circuits for protecting an input to a protected circuit.

With the continued demand for higher speed and lower power consumption integrated circuits a need exists for simple, low cost and reliable over voltage protection circuits. For example, CMOS based video graphics chips with 128 input/output ports (I/O) ports are required to operate at clock speeds of 125 MHz to 250 MHz. Such devices may use a 2.5 V power supply for much of its logic to reduce power consumption. One way to increase the operating speed of such devices is to decrease the gate length of core circuitry transistors. However, a decrease in the gate length of MOS devices can reduce the gate breakdown voltage to lower levels. For example, where an integrated circuit contains digital circuitry that operates from a 2.5 V source and is fabricated using silicon dioxide gate widths of 50 Angstroms, a resulting gate breakdown voltage may be approximately 3.5 volts. Such IC's must often connect with more conventional digital devices that operate at 5 V or 3.3 V. A problem arises when the core logic circuitry (operating at 2.5 volts) receives 5 V digital input signals from peripheral devices on input pins. Such standard 5 V input signals or 3.3 V input signals can cause breakdown damage if suitable voltage protection is not incorporated.

FIG. 1 shows a known over voltage protection arrangement that attempts to overcome this problem. As seen, a resistor R is placed in the input path from an input pin P to the input I of a MOS based core logic stage, such as an input/output port on a CPU or other processing unit. A clamping diode D is placed across the input I of the core logic stage and is connected to a 2.5 V supply voltage used by the core logic to clamp over voltages coming from pin P. In operation, resistor R restricts current flow to the core logic circuit and a voltage drop occurs across the resistor. When an input voltage is high enough to cause the diode D to conduct, the diode clamps the input voltage to a fixed level (2.5 V+diode junction voltage drop). Several problems arise with such a configuration. If the core logic is fabricated with gate widths of 50 angstroms, a breakdown voltage of only 3.5 volts is required to damage the core logic stage (0.7V/A*50a=3.5 V). With the diode drop of approximately 7 volts, a 3.2 V input voltage is a maximum input voltage to the core logic stage, however this is very close to the 3.5 V breakdown voltage so that over temperature and time, circuit reliability may be compromised. Also, the clamp diode D allows additional current to flow through the substrate which can cause latch-up of core logic circuitry.

Another problem is the use of resistor R. Such resistive elements take up large areas on integrated circuits and dissipate large amounts of power, hence heat, when an input voltage such as 5 volts is placed on pin P. In addition, a large time delay can occur due to the resistor R and the parasitic capacitance of the gate junction of the core logic circuit. This time delay reduces the speed of operation of the system.

Consequently there exists a need for a protection circuit that reduces power consumption, improves the speed of operation of a system in a simple and reliable manner. It would desirable if the protection circuit provided voltage scaling in a cost effective manner.

DETAILED DESCRIPTION OF THE INVENTION

A voltage scaling circuit for protecting an input node to a protected circuit uses a voltage shifting circuit that includes two nmos transistors. One nmos transistor is configured as a bi-directional voltage follower and the other nmos transistor is configured as uni-directional voltage follower to facilitate input high level shifting between an input signal node, such as a pin of an integrated circuit and an input node to the protected circuit.

Figure 1:
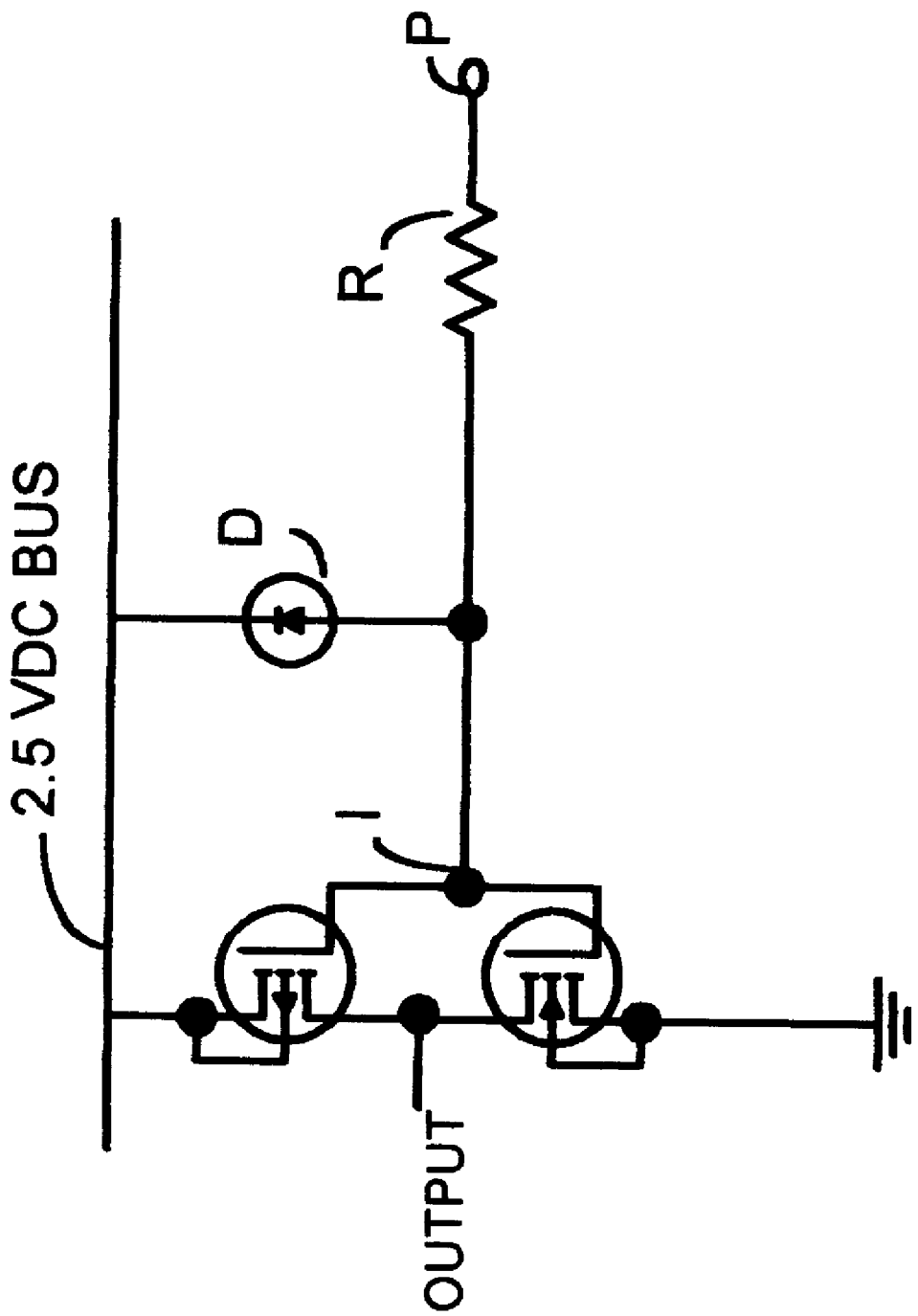
FIG. 1 is a circuit diagram generally depicting a prior art over protection circuit.
Figure 2:
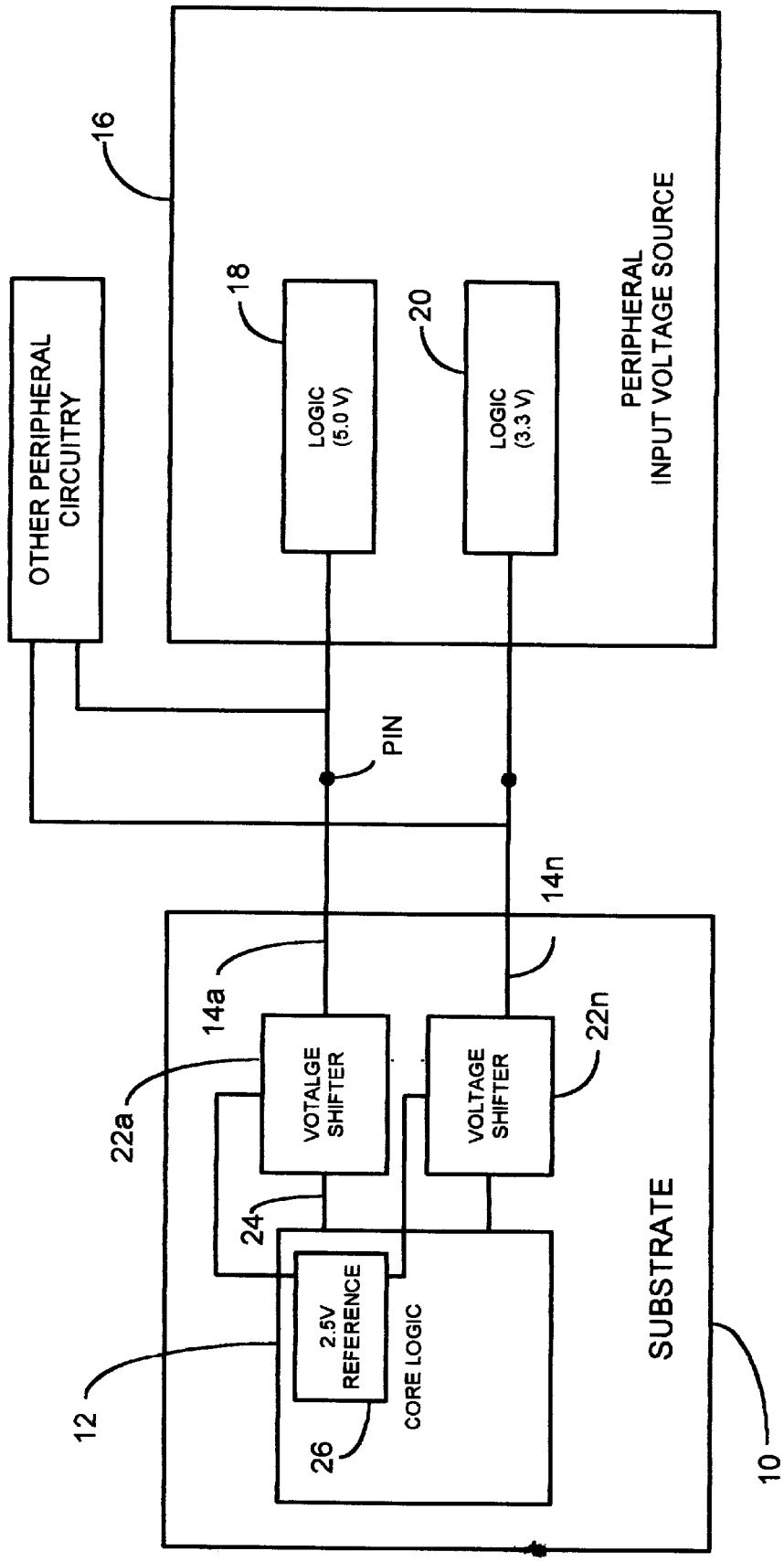
FIG. 2 is a block diagram generally depicting one embodiment of the invention.

FIG. 2 shows one embodiment of the invention where an integrated circuit substrate 10 contains MOS based core logic circuitry 12 that serves as the protected circuit. The substrate 10 has a plurality of input signal nodes 14a–14n which may be pins or pads that may be used to interface with peripheral circuitry 16 or other source of unacceptable voltage levels. The peripheral circuitry 16 may be any suitable logic circuitry 18 that may operate at a higher voltage level than the core logic circuitry 12. For purpose of illustration, signals from the logic circuitry 18 are 5 V digital signals. The peripheral circuitry 16 may also include other digital logic 20 that may operate at a different voltage such as 3.3 volts. The peripheral circuit 16 provides an input high voltage level signal coming from the logic circuits 18 and 20 to the core logic 12 through nodes 14a–14n. As an alternative, the peripheral circuitry 16 may not be on a substrate but may be other chips with associated pins. The substrate 10 includes voltage shifting circuits 22a–22n, each associated with a node or pin 14a–14n. The voltage shifting circuits 22a–22n are interposed between an input node 24 to the protected circuit 12 and an input signal node 14a. Each input signal node 14a–14n receives an over voltage input signal from the peripheral circuitry 16.

The core logic 12 includes a reference (or supply) voltage source 26, such as a 2.5 VDC reference source which is used throughout the core logic as a source voltage for the core logic circuitry. The reference voltage source 26 is connected to the voltage shifting circuits 22a–22n.

Figure 3:
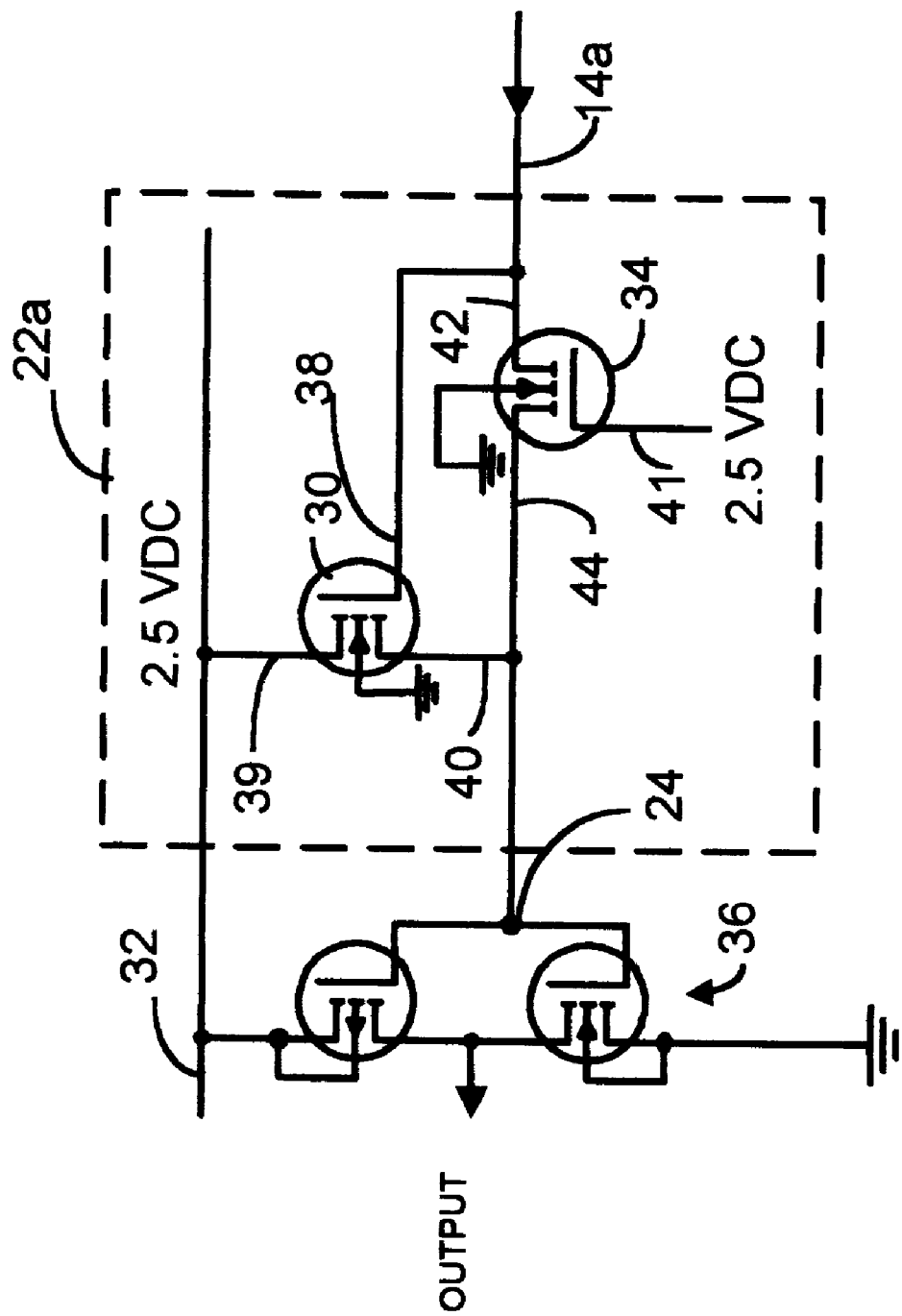
FIG. 3 is a circuit diagram depicting one embodiment of a voltage scaling circuit for protecting a circuit in accordance with one embodiment of the invention.

FIG. 3 shows one embodiment of a voltage shifting circuit 22a. As shown, the first core logic stage 36 (protected circuit) is an input stage of an I/O port. The voltage shifting circuit 22a includes an n-channel field effect (nmos) transistor 30 which is connected to the reference voltage source 26 through a reference voltage bus 32. The nmos transistor 30 is also connected to the input signal node 14a. The nmos transistor 30 is configured as an uni-directional voltage follower. Another n-channel field effect (nmos) transistor 34 is coupled in series with the input signal node 14a and the input node 24 of the core logic stage. The nmos transistor 34 is also coupled to the reference voltage bus 32 and is configured as a bi-directional voltage follower. The combination of the nmos transistors 30 and 34 facilitate input high voltage level shifting between the input signal node 14a and the input node 24 to a protected circuit 36. The nmos transistors 30 and 34 may be any suitable field effect transistors including poly silicon oxide type, metal oxide type or any other suitable type. The protected circuit 36 is one stage of core logic 12 that may be for example a MOS input stage of an input/output port having a configuration as shown. However, it will be recognized that any suitable circuit may also receive benefit from the disclosed invention.

The first nmos transistor 30 is configured as an unidirectional voltage follower by having its gate 38 connected to the input signal node 14a so that the gate receives incoming digital input signals for the protected circuit 36 from the peripheral circuitry 16. The first nmos transistor 30 has its drain 39 connected to the reference voltage bus 32 and its source 40 connected to the input node 24 to the protected circuit 36.

The second nmos transistor 34 has its gate 41 coupled to the reference voltage source through the reference voltage bus 32. A drain 42 of the second nmos transistor 34 is connected to the input signal node 14a so that the drain receives incoming digital input signals for the protected circuit 36. A source 44 of the second nmos transistor 34 is connected to both the source 40 of the first nmos transistor 30 and the input node 24 of the protected circuit 36.

Preferably the gate width of the nmos transistors 30 and 34 is the same as the gate width of the protected circuit 36, such as a gate width of 50 angstroms. The voltage shifting circuit 22a is fabricated on a same substrate as the protected circuit 36 in the form of a monolithic integrated circuit. In this way fabrication is enhanced by having a same gate width for all devices. This avoids having to fabricate larger width over voltage protection circuits on the die during fabrication. With the voltage shifting circuit 22a fabricated on the same substrate as the protected circuit 36, both the protected circuit and the voltage shifting circuit also use the common reference voltage source 26. The protected circuit and the voltage scaling circuit 22a are on a common I/O pad of the monolithic integrated circuit, although other suitable locations may also be used.

The reference voltage source may be any suitable voltage source such as a 2.5 voltage source as known in the art. The protected circuit 36 may be a portion of an nmos bi-directional port or any other suitable circuit.

In operation, when the input signal node 14a is receiving a rising edge of an over voltage input signal of 0 to 5 V digital signal, and the signal level is 0 V, the nmos transistor 30 is off since the gate voltage is also at 0 V. The nmos transistor 34 is on since its gate voltage is at the reference voltage of 2.5 V resulting in input node voltage to the protected circuit 36 of 0 V. As the over voltage input signal increases from 0 to 5 volts, the nmos transistor 34 provides a following input signal voltage to the protected circuit up to approximately 1.9 V (2.5 volts minus the gate to drain threshold voltage–0.6 volts). Also at this input signal level, the nmos transistor 30 begins to turn-on. When the input signal 14a reaches the over voltage level of 5 V, nmos transistor 30 is completely on and scales the input node voltage 24 to the reference voltage of approximately 2.5 V. In this way, during the rising edge of an input signal from 0 to 5 V, the protected circuit input 24 will never exceed the reference voltage.

In addition, the system having a reference voltage selected approximately ½ the level between an expected maximum over voltage level allows the system to maintain a 2.5 volt limit on any gate junction in the nmos transistors 30 and 34 so that these protection devices also do not experience voltage levels beyond their breakdown voltage. Although transistor 30 can have a 5 V over voltage signal at its gate when it is on, the voltage potential of the n-channel is 2.5V. Therefore, each gate junction is maintained within an acceptable voltage level. Also, the use of field effect transistors prevents excessive current being transferred to the substrate through the reference bus 32 in contrast with conventional protection circuits that use resistive elements. In addition, power consumption is lowered and delay is reduced due to the elimination of the resistive element. For example a 128 pin I/O port section of a processing unit employing the above described design can have substantially reduced power consumption during normal operation when the input signal is from a 5 volt peripheral circuit.

During a falling edge of a digital over voltage input signal from 5 V to 0 V, the uni-directional nmos transistor 30 begins to turn off when the input voltage of the digital pulse falls to about 2.5 V. The bidirectional nmos transistor 34 begins to turn on when the input signal falls to about 2.0 V and causes the voltage at the node 24 to follow the falling voltage down to zero volts.

The uni-directional nmos transistor 30 produces only a high voltage (2.5V) to the input 24 of the protected circuit, or it is off. The bidirectional nmos transistor 34 provides a high voltage (2.5V-Vthreshold) when the over voltage input changes from 0V to 5V and provides a low voltage to the input 24 of the protected circuit when the over voltage input changes from 5V to 0V. Hence nmos transistor 30 generates a high voltage or nothing and nmos transistor 34 generates either a high voltage or a low voltage to the input 24.

It will be recognized that the drain and source of nmos transistor 34 may be reversed such that the source is connected to the input signal node 14a and the drain is connected to the input node 24. Also, the reference voltage for the nmos transistor 34 need not be the same reference voltage as that for the nmos transistor 30. It should be understood that the implementation of other variations and modifications of the invention in its various aspects will also be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A voltage scaling circuit for protecting an input node to a protected circuit comprising:
   a reference voltage source;
   a voltage shifting circuit operatively interposed between the input node to the protected circuit and an input signal node that receives an overvoltage input signal, the voltage shifting circuit having:
      a first circuit, operatively coupled to the reference voltage source and to the input signal node to receive incoming digital input signals for the protected circuit, configured as a unidirectional voltage follower; and
      a second circuit, operatively coupled to the reference voltage source and to the input signal node, configured as a bidirectional voltage follower to facilitate input high voltage level shifting between the input signal node and the input node to the protected circuit.

2. The voltage scaling circuit of claim 1 wherein the voltage shifting circuit is fabricated on a same substrate as the protected circuit in the form of a monolithic integrated circuit.

3. The voltage scaling circuit of claim 1 wherein the reference voltage source is common to both the protected circuit and the voltage shifting circuit and wherein the protected circuit is an nmos bidirectional port.

4. The voltage scaling circuit of claim 2 wherein the first circuit includes a first nmos transistor having a first gate coupled to the input signal node so that the first gate receives incoming digital input signals for the protected circuit, and wherein the first nmos transistor has a first drain coupled to the reference voltage source and a first source coupled to the input node to the protected circuit.

5. The voltage scaling circuit of claim 4 wherein the second circuit includes a second nmos transistor having a second gate coupled to the reference voltage source, a second drain coupled to the input signal node so that the second drain receives incoming digital input signals for the protected circuit, and a second source coupled to the first source and input node of the protected circuit.

6. The system of claim 1 wherein the protected circuit and the voltage scaling circuit are on a common I/O pad of an integrated circuit.

7. A voltage scaling circuit for protecting an input node to a protected circuit comprising:

a reference voltage source;

a voltage shifting circuit operatively interposed between the input node to the protected circuit and an input signal node that receives an overvoltage input signal, the voltage shifting circuit having:

a first nmos transistor having a first gate coupled to the input signal node so that the first gate receives incoming digital input signals for the protected circuit, a first drain coupled to the reference voltage source, and a first source coupled to the input node to the protected circuit; and a second nmos transistor having a second gate coupled to the reference voltage source, a second drain coupled to the input signal node so that the second drain receives incoming digital input signals for the protected circuit, and a second source coupled to the first source and input node of the protected circuit.

8. The voltage scaling circuit of claim 7 wherein the voltage shifting circuit is fabricated on a same substrate as the protected circuit in the form of a monolithic integrated circuit.

9. The voltage scaling circuit of claim 7 wherein the reference voltage source is common to both the protected circuit and the voltage shifting circuit and wherein the protected circuit is an nmos bidirectional port.

10. The system of claim 8 wherein the protected circuit and the voltage scaling circuit are on a common I/O pad of the monolithic integrated circuit.

* * * * *